United States Patent [19]

Ezumi et al.

[11] 4,086,093

[45] Apr. 25, 1978

[54] DRY PLANOGRAPHIC PRINTING PLATE

[75] Inventors: Yuh Ezumi, Kyoto; Masaharu Kobayashi; Takashi Kubota; Yoichi Shimokawa, all of Otsu, all of Japan

[73] Assignee: Toray Industries, Inc., Tokyo, Japan

[21] Appl. No.: 713,576

[22] Filed: Aug. 11, 1976

Related U.S. Application Data

[63] Continuation of Ser. No. 514,063, Oct. 11, 1974, abandoned.

[51] Int. Cl.$^2$ .............................................. G03G 1/68
[52] U.S. Cl. ..................................... 96/86 P; 96/114; 96/115 R; 96/35.1
[58] Field of Search ................... 96/86 P, 115 R, 114

[56] References Cited

U.S. PATENT DOCUMENTS

| 3,632,375 | 1/1972 | Gipe | 96/33 |
| 3,661,576 | 5/1972 | Crary | 96/35.1 |
| 3,677,178 | 7/1972 | Gipe | 96/33 |
| 3,753,715 | 8/1973 | Klupfel | 96/115 P |
| 3,758,306 | 9/1973 | Ross | 96/83 |

*Primary Examiner*—John D. Welsh
*Attorney, Agent, or Firm*—Miller & Prestia

[57] ABSTRACT

A laminated negative acting presensitized planographic printing plate for use in dry planography having
(a) a base layer.
(b) a silicone rubber layer overlying the base layer, and
(c) a photoadhesive layer overlying the silicone rubber layer comprising at least one photopolymerizable unsaturated compound having a boiling point above 100° C and a photoinitiator.

Under exposure to light through a negative transparency, the photoadhesive layer polymerizes in the exposed image area and adheres to the underlying silicone rubber layer, while remaining non-adhesive to the underlying silicone rubber layer in the unexposed non-image area.

The unexposed photoadhesive layer only is removed to bare the underlying silicone rubber layer which is made an ink-repellent non-image area and the photoadhesive layer remaining in the exposed area is made an ink-receptive image area.

The surface of the photoadhesive layer accepts ink from inking rollers, while the silicone rubber background area will not remove ink from the rollers and thus remains ink free.

14 Claims, No Drawings

DRY PLANOGRAPHIC PRINTING PLATE

This is a continuation of application Ser. No. 514,063, filed Oct. 11, 1974 now abandoned.

BACKGROUND OF THE INVENTION

The present invention relates to a negative-type planographic printing plate having ink-repellent silicone rubber in a non-imaged area and is capable of printing in the absence of dampening.

Heretofore, several proposals have been made with reference to a dry planographic plate having an ink-repellent layer of silicone rubber, all of which, however, have various deficiencies such as having inferior strength of the printing plate or presenting problems in developing method. For example, what is disclosed in Japanese patent publication No. 2361/1972 is a presensitized planographic printing plate providing a photo-insolubilizable water soluble diazonium resin layer on the layer of silicone rubber. When a negative transparency is put on said plate and exposed to light and thereafter treated with aqueous developing liquid, the diazonium resin layer in the unexposed area dissolves to expose the surface of the silicone rubber layer to form an ink-repellent non-imaged area, whereas in the exposed area, the hardened diazonium resin layer remains to form an ink-receptive image area. However, there is insufficient adhesion between the diazonium resin layer in the image area and the underlying silicone rubber layer, and this deficiency of the planographic printing plate is such that the diazonium resin layer of the image area is peeled by inking rollers during printing or is removed by careless scratch.

An object of the present invention is to overcome such deficiencies and to provide a negative-type planographic printing plate excellent in adhesive strength of the ink-receptive image area, surface strength of the printing plate, storability, scratch resistance and high durability in long run printing.

Another object of the present invention is to provide a negative-type planographic printing plate having excellent reproducibility of image and broad permissible range of the exposing time.

SUMMARY OF THE INVENTION

The presensitized dry planographic printing plate in the present invention is a negative acting plate comprised of
(a) a base layer,
(b) a silicone rubber layer overlying the base layer, and
(c) a photoadhesive layer overlying the silicone rubber layer, comprising at least one photopolymerizable unsaturated compound having a boiling point above 100° C and a photoinitiator.

Upon exposure to light through a negative transparency, the photosensitive layer in the exposed image area polymerizes and adheres firmly to the underlying silicone rubber layer, whereas the photoadhesive layer in the unexposed non-image area remains non-adhesive to the underlying silicone rubber layer.

Next, a planographic printing plate is produced in which the photoadhesive layer is removed only in the unexposed area to bare the underlying silicone rubber layer, the photoadhesive layer remaining in the exposed area is made an ink-receptive image area and the silicone rubber layer in the unexposed area is made an ink-repellent non-image area.

The present invention has the following novel and important characteristics. Upon irradiating actinic light through a negative transparency to the printing plate, the photoadhesive layer in the exposed area not only polymerizes and cross-links to become insoluble, but also adheres to the underlying silicone rubber layer and cannot be easily peeled off. As a result, the adhesive strength of the ink-receptive image area of the resulting printing plate and eventually the strength of the plate surface is increased remarkably, and not only are the storability and scratch resistance improved, but also the durability in long-run printing is strikingly increased. In this case photoadhesion in the interface between the photoadhesive layer and the silicone rubber layer has a very important significance, which is remarkably different from the hitherto known cases.

The flexible base substrate employed in the present invention should be sufficiently flexible for mounting on a lithographic press and strong enough to withstand the load normally produced by the lithographic press. Representative substrates include coated paper, metals or plastics such as polyethylene terephthalate. However, it is most preferable to use a substrate whose reflectivity to light of a wave length of 300 – 400mµ is not more than 20%, since the reproducibility of the image is thereby strikingly improved. In case such halation-preventing substrate is used, the permissible range of the exposure time (range width of proper exposure time) is broadened and it is possible to obtain a sharp image relief from highlights to shadows.

The fact that a halation-preventing substrate develops such great effect in a planographic printing plate without requiring water having a photosensitive resin layer on a silicone rubber layer was not recognized in the prior art. It is well known to provide a halation-preventing layer beneath a photosensitive resin layer upon applying a photopolymerizable resin to the production of ordinary relief and lithographic printing plates. However, the present invention is entirely different in structure from the known cases in that a halation-preventing layer is provided beneath a silicone rubber layer supporting a photosensitive resin layer.

If, as in the prior art, a halation-preventing layer is provided between a photoadhesive layer and a silicone rubber layer photoadhesion is not realized and a photoinsolubilized relief easily peels from the silicone rubber layer. The superiority of a halation-preventing base substrate beneath the silicone rubber layer as in the present invention is thus readily understood.

The halation-preventing base substrate used in the present invention has adequate flexibility for mounting on an ordinary lithographic press and is strong enough to readily withstand the load normally produced by the lithographic press. As illustrative of such base substrates, the following may be cited:
(1) a metal plate, paper or a plastic sheet provided with a halation-preventing layer on the surface,
(2) a substantially transparent plastic film provided with a halation-preventing layer on the back surface, and
(3) paper and plastic film impregnated with or having dispersed therein an ultraviolet light absorbing agent.

Following is a list of effective ultraviolet light absorbing agents. These ultraviolet light absorbing agents may be dissolved or dispersed in solutions of various polymer binders and applied to the base substrate to thereby provide halation-preventing layers.

(1) benzophenone derivatives: 2,2'-dihydroxy-4-methoxy benzophenone, 5-chloro-2-hydroxy benzophenone, 4,4'-dimethylamino benzophenone or "Light Absorber DBR" manufactured by Dow Chemical Co. of U.S.A.

(2) benzotriazol derivatives: "Tinuvin P", 2-(2'-hydroxy-5'-methyl-phenyl)-benzotriazol and "Tinuvin 320", ingredients not made public manufactured by Geigy Ltd. of Switzerland.

(3) phenyl salicylate and derivatives thereof: 4-t-butylphenyl salicylate and 4-octylphenyl salicylate.

(4) acrylonitrile derivatives: "Ubinul N-35", ethyl 2-cyano-3,3-diphenylacrylate, and "Ubinul 530". N-539",2-diethylhexyl-2-cyano-3,3-ciphenyl acrylate, manufactured by Antala Chemical Co. of U.S.A.

(5) other commercially available ultraviolet light absorbing agents, such as: "Inhibitor-HRT" "HPT," hexamethyl phosphoric triamine, manufactured by Eastman Chemical Co. of U.S.A., "Stouffer Stabilizer-UV928" and "Stouffer Stabilizer-UV1261", the ingredients of both of which are not made public, manufactured by Stouffer Chemical Co. of U.S.A. as well as "C1729" and "AM101", the ingredients of both of which are nickel bisoctyl phenyl sulfide, manufactured by Ferro Chemical Co. of U.S.A.

(6) yellow and red conventional inorganic and organic pigments, the Colour Index nunbers for which are as indicated: Orange Lake CI 77199, Molybdenum Orange, Cadmium Yellow, Yellow Lead, CI 77600 Lead Chromate CI 77601, Hansa Yellow CI 11670, Chromium Vermillion, CI 77605, Red Lead CI 77578, Lake Red C CI 15585, Chromium Red, Red Iron Oxide CI 77491, Washing Red, Bon Maroon CI 77766, Vermillion, etc.

For the purpose of improving adhesion between such halation-preventing base substrates and a silicone rubber layer, it is preferable to apply a thin (0.05 - 1.0μ) coating of silicone primer (surface treating agent) to the surface of said substrate.

As silicone primers used for such purpose, besides commercially available primers such as "SH 4094", "SH 1200" and "SH 1201", silane coupling agents such as "SH 6020", "SH 6040" and "SH 6075" may be cited, all manufactured by Toray Silicone Co. of Japan.

The thickness of the silicone rubber layer used in the present invention is not particularly critical, and is useful in the normal range of 0.5 - 50μ, and preferably 1 - 10μ.

Useful silicone rubber is obtained by sparsely cross-linking a linear diorganopolysiloxane (preferably dimethyl polysiloxane) which is a base polymer. The density of this cross-linking may be expressed by an R/Si ratio in the following formula, and in useful silicone rubber, such density is within the range of 1.95 - 2.10, preferably 1.99 - 2.01. A representative silicone base polymer has the following repeating unit

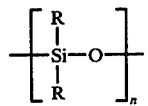

wherein $n$ is an integer not less than 2, R stands for an alkyl, halogenated alkyl, vinyl aryl or cyanoalkyl group having 1 - 10 carbon atoms, it being preferable that at least 60% of R is methyl group.

Useful silicone rubber in the present invention is obtained by condensation reaction of such silicone base polymer and the following silicone cross-linking agent (1) $R - Si(OR')_3$ (2) $R - Si = (OAc)_3$ (3) $R - Si(ON - CR'_2)_3$ wherein R has the same meaning as mentioned above, R' stands for an alkyl such as methyl and ethyl and Ac stands for acetyl group.

Other useful silicone rubbers may be obtained by reaction of the aforesaid base polymer with H-type silicone oil having the following repeating unit or addition reaction of the aforesaid base polymers in which about 3% of R is vinyl group, or reaction between said H-type silicone oils.

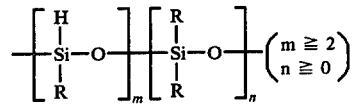

R has the same meaning as mentioned above.

In order to obtain silicone rubber by such cross-linking reaction, besides the aforesaid components, an organometallic carboxylic acid salt of a metal such as tin, zinc, cobalt, lead, calcium and manganese, for example, dibutyl tin laurate, stannic octoate and cobalt naphthenate or a catalyst like chloroplatinic acid is added.

In order to improve the tenacity of silicone rubber and obtain silicone rubber which can withstand frictional force produced during printing, it is possible to mix a filler with the silicone rubber. Silicone rubber premixed with a filler is commercially available as silicone rubber stock or silicone rubber dispersion. In case it is preferable to obtain silicone rubber film by coating as in the present invention, RTV or LTV silicone rubber dispersion is preferably used. As examples of such silicone rubber dispersions, there are silicone rubber dispersions for paper coating such as "Syl off 23," "SRX-257" and "SH-237" manufactured by Toray Silicone Co., Ltd. of Japan.

In the present invention, by incorporating a small amount of photosensitizer in the silicone rubber layer in addition to the aforementioned components, the effectiveness is greatly enhanced. By using such silicone rubber composition, the photoadhesion between the silicone rubber layer and the photoadhesive layer is remarkably increased and it very conveniently provides for achieving the object of the present invention. As such photosensitizer for incorporation in the silicone rubber layer, it is possible to use the same photosensitizer (photoinitiator) which will be contained in a photoadhesive layer to be mentioned later. Most particularly, aromatic ketones, especially benzoin alkylethers are conveniently used. As representative examples of such benzoin alkylethers, there may be cited benzoin ethyl ether, benzoin isopropyl ether and benzoin butyl ether. Amounts to be contained of these photosensitizers are normally 0.1 - 10% by weight based on the total weight of the silicone rubber layer.

The thickness of a photopolymerizable adhesive layer used in the present invention is not particularly limited, but is normally within the range of 0.5 – 50μ, and preferably 1 – 10μ.

The following is the composition of such a photopolymerizable adhesive layer:

(1) at least one kind of photopolymerizable unsaturated compound having a boiling point above 100° C
   5.0 – 99.9 parts by weight
(2) photoinitiator
   0.1 – 10.0 parts by weight
(3) heat polymerization inhibitor as occasion demands
   0.001 – 0.1 part by weight
(4) polymer or inorganic powder as filler for maintaining the dimensional stability of a photoadhesive layer as occasion demands
   0.01 – 90.0 parts by weight.

The photopolymerizable unsaturated compound referred to herein means photopolymerizable unsaturated monomers and oligomers.

As such monomers and oligomers, various compounds may be used. However, it is preferable to make at least one kind of such compound a monomer or oligomer containing at least one hydroxyl group and at least one acryloyl or methacryloyl group in the same molecule. It is especially preferable to make the total concentration of the hydroxyl group and the total concentration of the acryloyl group or methacryloyl group in the photoadhesive layer at least 0.1 mmol/g, respectively. The upper limits of these total concentrations are about 15 mmol/g, respectively.

By using such monomer or oligomer, the outstanding improvement provided by the present invention in the aforesaid characteristics of adhesive strength of the ink-respective image area, scratch resistance and high durability in long run printing, is most effectively realized.

This fact becomes more evident upon comparison with a case in which the total concentration of the hydroxyl group and the total concentration of the acryloyl and methacryloyl groups are less than 0.1 mmol/g, respectively. Although photoinsolubilization may be achieved in such case, the adhesion to the surface of the underlying silicone rubber is inadequate in that the frictional forces generated during development prevent the formation of the relief of the image area, or even if the relief is formed it simply peels when it is lightly rubbed with the finger tip.

The following compounds may be cited as examples of the aforesaid monomer or oligomer containing at least one hydroxyl group and at least one acryloyl or methacryloyl group in the same molecule:

(1) (metha)crylic acid partial ester of a polyhydric alcohol containing 2 – 12 carbon atoms,
(2) addition product of active hydrogen compounds having 1 – 12 carbon atoms such as alcohols, thiols, amines, carboxylic acids, sulfonic acids, phenols, phosphoric acids or hydrogen halide with glycidyl (metha)crylate,
(3) addition product of monoepoxy or polyepoxy compound having 2 – 14 carbon atoms with (metha)crylic acid,
(4) ester of N-methylol(metha)crylamide and oxycarboxylic acid having 2 – 10 carbon atoms,
(5) addition product of N-methylol(metha)crylamide with monoepoxy or polyepoxy compound having 2 – 12 carbon atoms.

Of such monomers and oligomers, those having at least 2 acryloyl or methacryloyl groups and at least 1 alcoholic hydroxyl group are preferable and those having at least 2 acryloyl or methacryloyl groups and at least 2 alcoholic hydroxyl groups are most preferable.

Compounds of the aforesaid monomers and oligomers that are especially useful will be listed below, some of which may be used as raw material for oligomers useful in the present invention:

(1) (metha)crylic acid partial esters of ethylene glycol, propylene glycol, glycerol, sorbitol, trimethylol methane, trimethylol ethane, trimethylol propane and pentaerythritol,
(2) adducts of glycidyl (metha)acrylate with hydrogen chloride, methanol, ethanol, ethylene glycol, trimethylol methane, pentaerythritol, ethanol amine, triethanol amine, ethane dithiol, methylamine, ethylenediamine, xylylenediamine, aniline, phenylenediamine, acetic acid, (metha)crylic acid, malonic acid, succinic acid, maleic acid, fumaric acid, itaconic acid, malic acid, tartaric acid, citric acid, phenol, thiophenol or hydroquinone,
(3) addition products of glycidyl ester having at least 2 1 epoxy groups and 9 – 14 carbon atoms with (metha)crylic acid, for example, addition product of (metha)crylic acid with glycidyl esters of phthalic acid, tetrahydrophthalic acid, succinic acid, adipic acid, maleic acid, fumaric acid or itaconic acid.
(4) diester of N-methylol(metha)crylamide with malic acid, tartaric acid, and citric acid,
(5) addition product of N-methylol (metha)crylamide with glycidyl ester of (metha)crylic acid, phthalic acid, tetrahydrophthalic acid, maleic acid, fumaric acid or itaconic acid.

Aside from the aforementioned (metha)crylic monomers having alcoholic hydroxyl groups, it is possible to cause other ethylenically unsaturated monomers to co-exist as occasion demands. However, whatever monomers are added, it is preferable that the concentrations of (metha)cryloyl group and hydroxyl group as a photoadhesive layer composition be kept above 0.1 mmol/g.

It is possible to cause other photopolymerizable monomers or oligomers to co-exist in the photoadhesive layer an occasion demands and as representative examples of such monomer or oligomer, there may be cited a (metha)crylic acid ester or (metha)crylamide having a boiling point above 100° C derived from a monohydric alcohol or monovalent amine having not more than 30 carbon atoms or (metha)crylic acid ester or (metha)-crylamide having a boiling point above 100° C derived from a polyhydric alcohol or polyvalent amine having not more than 80 carbon atoms, the representative examples of such compounds being as follows:

(1) (metha)crylic acid ester of the following alcohols: methanol, ethanol, propanol, pentanol, cyclohexanol, octanol, undecanol, bornyl alcohol, polymethylene glycol, ethylene glycol, polyethylene glycol, propylene glycol, polypropylene glycol, glycerol, trimethylol methane and pentaerythritol,
(2) (metha)crylamide derivatives shown below: (metha)crylamide, N-methylol(metha)crylamide, N-methoxymethyl(metha)crylamide, methylene bis-(metha)crylamide, hexamethylene bis-(metha)-crylamide, diacetoneacrylamide and dihydroxymethyldiacetoneacrylamide.

As representative examples of the photoinitiator which may be used in the present invention, the following compounds may be cited:

(1) Benzophenone derivatives such as, for example, benzophenone, Michler's ketone, xanthone, anthrone, etc.,
(2) benzoin derivatives such as, for example, benzoin, benzoin methyl ether, benzoin ethyl ether, etc.,
(3) quinones such as, for example, p-benzoquinone, β-methylanthraquinone, etc.
(4) sulfur compounds such as, for example, dibenzyl disulfide, di-n-butyl disulfide, etc.
(5) azo or diazo compounds such as, for example, 2-azo-bis-isobutyronitrile, 1-azo-bis-cyclohexane carbonitrile, p-diazobenzylethylaniline, Congo Red, etc.
(6) halogen compounds such as, for example, carbon tetrabromide, silver bromide, α-chloromethylnaphthalene, etc.
(7) peroxides such as, for example, benzoyl peroxide, etc.
(8) uranyl salts such as, for example, uranyl nitrate, etc.

It is possible to select most suitable photoinitiators by taking into account the miscibility with other components of a photoadhesive layer and the spectrum of the light source used for exposure. Generally, the following photoinitiators are most preferable:

Benzophenone, Michler's ketone, xanthone, benzoin methyl ether, dibenzyl disulfide and uranyl nitrate In addition to the aforementioned components it is useful to add a small amount of heat polymerizable inhibitor to the photoadhesive layer for the purpose of improving the storability of the printing plate. As representative examples of such heat polymerization inhibitor, hydroquinone, phenothiazine, 2,4-dinitrophenol and triphenylmethane may be cited. It is also possible to add a dye such as Crystal Violet Powder to the photoadhesive layer so that an exposed area is easily visually discriminated.

Further, it is also possible to mix inorganic powder or polymer with the photoadhesive layer as occasion demands for the purpose of imparting dimensional stability to the photoadhesive layer and improving adhesion to the silicone rubber.

The printing plate so produced achieves improvement in the storability, scratch resistance and durability of the printing plate in long run printing.

On the other hand, these additives tend to cause lowering of the concentration of the (metha)crylic monomer having the hydroxyl group, which is indispensable for the photoadhesive layer.

Because of such possible adverse effects in the present invention it is preferable to so control the weights of the additives as to keep the molar concentrations of (metha)cryloyl group and hydroxyl group derived from a (metha)crylic monomer more than 0.1 mmol/g as the photoadhesive layer composition.

Suitable inorganic powders may usefully be dispersed in the photoadhesive layer and as representative examples of such powders, colloidal silica, calcium carbonate and titanium dioxide may be cited.

A polymer to be added must have properties of ability to mix uniformly with other components of the photoadhesive layer, namely, the monomer, oligomer and photoinitiator in a solution or molten state. The desired composition must dissolve or swell in the developing liquid and must be easily removed in the developing step. The following polymers and copolymers may be used as the desired polymers provided they have such properties. It is possible to mix these polymers and copolymers in the usual manner an occasion demands and use the resultant mixtures.

(1) Vinyl polymers or (metha)crylic acid, (metha)crylic acid ester polymers and copolymers thereof:

For example, polymers such as polyvinyl alcohol, polyvinyl formal, polyvinyl butyral, or polymers or copolymers of vinyl acetate, vinyl chloride, ethylene, vinyl methyl ether, styrene, (metha)crylic acid, methyl-, ethyl-, cyclohexyl-, benzyl-, 2-ethylhexyl-, glycidyl-, 2-hydroxyethyl-, 2-hydroxypropyl-, 3-chloro-2-hydroxy-propyl- and dimethylaminoethyl-, 2-acid-phosphoxy-ethyl-, 3-chloro-acid-phosphoxyethyl (metha)crylates, and (metha)crylamide, N-methylol(metha)crylamide, N-methoxybutyl(metha)crylamide, hydroxymethyldiacetoneacrylamide, 2-acrylamide-2-methylpropane sulfonic acid.

(2) Unvulcanized rubber such as, for example, natural rubber, polybutadiene, polyisobutylene, polychloroprene, polyneoprene or copolymers thereof.

(3) Polyethers such as, for example, polyethylene oxide and polypropylene oxide.

(4) Polyamides such as, for example, copolymers of the following monomers: caprolactam, laurolactam, hexamethylenediamine, 4,4'-bis-aminocyclohexylmethane, 2, 4, 4-trimethylhexamethylenediamine, isophoronediamine, diglycolic acid, isophthalic acid, adipic acid, sebacic acid, etc.

(5) Cellulose derivatives such as, for example, cellulose acetate, methylcellulose, carboxymethylcellulose, hydroxypropylcellulose, etc.

(6) Polyesters such as, for example, condensation products of phthalic anhydride, maleic anhydride, bis-phenol A, ethylene oxide and propylene oxide.

(7) Polyurethane such as, for example, polyurethane of hexamethylene diisocyanate, toluene diisocyanate and naphthalene 1, 5-diisocyanate with 1, 4-butanediol.

(8) Prepolymers of epoxy, urea, alkyd, melamine and phenol resins.

(9) Gum rosin, polyterpene, and cumarone - indene resin.

(10) Other polymers such as, for example, gum arabic and gelatin.

These polymers are selected in combination with the kind of developing liquid used. However, the following compounds are especially useful:

A polyvinyl acetate, polyvinyl alcohol, polyvinyl butyral, copolymer of (metha)crylic acid and/or maleic acid, fumaric acid, itaconic acid (0 – 20 parts by weight) - methyl methacrylate and/or styrene (0 – 50 parts by weight) - (metha)crylic acid ester having 5 – 20 carbon atoms and/or vinyl acetate (20 – 100 parts by weight), or copolyamides of nylon 6 - nylon 66 - 2, 2, 4-trimethylhexamethylene diamine 6 (1:1:1 by weight) or nylon 6 - nylon 66 - 4, 4'diaminocyclohexylmethane 6 (1:1:1 by weight).

As explained above, the base substrate, the silicone rubber layer and the photoadhesive layer are indispensable elements of a planographic printing plate according to the present invention. However, the surface of the so constituted planographic printing plate is somewhat tacky, tending to cause dust to adhere thereto and thereby posing the problem that a negative transparency is unlikely to adhere sufficiently close to said surface in the exposure step. It may therefore be desirable to interpose a thin transparent protecting film or to form a protecting layer on the surface of the photoadhesive layer using a polymer solution. This protecting film also plays a role of inhibiting osmosis (permeation) at atmospheric oxygen into the photoadhesive layer and promoting photopolymerization of the photoadhesive layer. Such protecting film is useful in the exposure step, but it is obvious that the protecting film is removed by peeling or dissolution in the developing step and it is unnecessary in the printing step.

Useful protecting films have transparencies capable of transmitting ultraviolet light (ray) having a wave length of 300 - 400m$\mu$ and a thickness below 50$\mu$, preferably below 10$\mu$. As representative examples of such useful films layers, the following plastics may be cited:

Polyethylene, polypropylene, polyvinyl chloride, polyvinylidene chloride, polyvinyl alcohol, polyethylene terephthalate and cellophane.

As explained above, a planographic printing plate as a laminate according to the present invention may be produced, for example, by the following three methods:

(1) To the base substrate, a silicone rubber dispersion is applied using ordinary coaters such as reverse roll coater, air knife coater and Mayerbar coater. In this case, it is possible to pretreat the base substrate with silicone primer. Next, the solution of a photoadhesive layer composition is applied to the silicone rubber layer by the same method used in applying the silicone rubber dispersion. In applying this solution it should not disturb the smooth surface of the silicone rubber layer. It is possible to add a paint additive of the silicone series or a surface active agent of the fluorine series to said solution for producing a uniform coating of said solution as occasion demands.

(2) On a peelable carrier sheet, for example, polyethylene, polypropylene and polyethylene terephthalate films, metal sheets, or silicone coated releasing paper or films, a photoadhesive layer is formed. The aforesaid photoadhesive layer formed on the peelable carrier sheet is caused to adhere closely onto a silicone rubber layer provided on the base substrate by the same method as in (1) above. In this case, it is possible to pretreat the surface of said photoadhesive layer with silicone primer.

(3) A silicone rubber dispersion is applied to a photoadhesive layer provided on a peelable carrier sheet by the same method as in (2) above, and sufficiently dried. Additionally, a base substrate is treated with silicone primer and is caused to closely adhere to the silicone rubber layer produced previously.

The peelable carrier sheets of (2) and (3) above, may be made protecting films per se, but it is also possible to paste on new protecting films after peeling said carrier sheets. Similar good photosensitivity may be obtained using the plate without protecting film, if exposure is made after the plate is stored in an atmosphere of gases like nitrogen and carbon dioxide to expel the dissolved oxygen of the photoadhesive layer.

As a method of providing the protecting film, besides the aforesaid film lamination, it is possible to use a method of applying a polymer solution like polyvinyl alcohol onto the surface of the photoadhesive layer or applying said polymer solution onto the peelable carrier sheet to form an oxygen transmission preventing layer in advance, applying the photoadhesive layer thereon and peeling the peelable carrier sheet at a time when lamination of the silicone rubber layer and the base substrate is completed.

The planographic printing plate of the present invention produced as described in the foregoing, is exposed to actinic light through a negative transparency closely adhered to said plate in vacuo. The light source used for this exposure step should generate abundant ultraviolet rays (light), and mercury lamps, carbon arc lamps, xenone lamps, metal halide lamps or fluorescent lamps may be used as such light source.

In the printing plate which has been exposed to light, not only does the photoadhesive layer of the exposed area harden by photopolymerization cross-linking reaction, but it also adheres strongly to the underlying silicone rubber layer. Therefore, depending upon the kind of the protecting film and the composition of the photoadhesive layer, when the protecting film is peeled after exposure, the photoadhesive layer of the unexposed area peels together with the protecting film and only the photoadhesive layer of the exposed area adheres to the silicone rubber layer and remains. In such case, the developing operation is completed by merely peeling off the protecting film without resort to use of the developing liquid anew.

It is possible to selectively elute the photoadhesive layer of the unexposed area by immersing the plate in developing liquid or spraying the developing liquid thereon after peeling the protecting film.

It is possible to expose or heat the entire surface after development as occasion demands to strengthen the adhesion between the photoadhesive layer and the silicone rubber layer and to thereby further improve the durability in long run printing of the plate.

In the following, the present invention will be explained in further detail by reference to examples. The ethylenically unsaturated monomer (photopolymerizable monomer) and the concentrations of the methacryloyl group and the alcoholic hydroxyl group contained therein used in these examples will be shown in Table 1.

Table 1

| | Photopolymerizable monomer | Chemical structural formula | (Metha)cryloyl group mmol/g | Alcoholic hydroxyl group mmol/g |
|---|---|---|---|---|
| Example 1 | Addition product of 4 mols of GMA/1 mol of xylylenediamine | 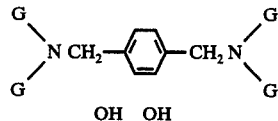 | 5.7 | 5.7 |
| Example 2 | Addition product of 2 mols of GMA/1 mol of tartaric acid | 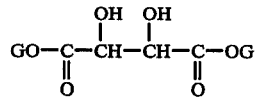 | 4.6 | 9.2 |

Table 1-continued

| | Photopolymerizable monomer | Chemical structural formula | (Metha)cryloyl group mmol/g | Alcoholic hydroxyl group mmol/g |
|---|---|---|---|---|
| Example 3 | Mixture of glycerin monoacrylate with ethylene glycol diacrylate (weight ratio 24:16) | $\text{AcrOCH}_2-\overset{\overset{\text{OH}}{\|}}{\text{CH}}-\text{CH}_2\text{OH}$<br>$\text{AcrOCH}_2\text{CH}_2\text{OAcr}$ | 8.7 | 9.1 |
| Example 4 | Mixture of N-methylolacrylamide with ethylene glycol diacrylate (weight) ratio 24:16) | $\text{AcrNHCH}_2\text{OH}$<br>$\text{AcrOCH}_2\text{CH}_2\text{OAcr}$ | 10.5 | 5.9 |
| | Pentaerythritol diacrylate | $(\text{AcrO})_2\text{C}(\text{CH}_2\text{OH})_2$ | 8.1 | 8.1 |
| | Addition product of 1 mol of GMA/1 mol of acrylic acid | G—O—Acr | 9.3 | 4.6 |
| | Addition product of 1 mol of GMA/1 mol of N-methylol acrylamide | G—OCH$_2$NAcr | 8.2 | 4.1 |
| Comparative Examples 1 and 2 | Ethylene glycol diacrylate | $\text{AcrOCH}_2\text{CH}_2\text{OAcr}$ | 11.6 | 0 |
| | Trimethylolethane triacrylate | $\text{CH}_3\text{C}(\text{CH}_2\text{OAcr})_3$ | 10.8 | 0 |
| | Mixture of ethylene bis-acrylamide with tetraethylene glycol | $\text{AcrNHCH}_2\text{NHAcr}$<br>$\text{Acr}-(\text{OCH}_2\text{CH}_2)_4\text{OAcr}$ | 8.6 | 0 |

GMA: glycidyl methacrylate $$G: CH_2=\underset{\underset{}{}}{\overset{\overset{CH_3}{|}}{C}}-\underset{\underset{O}{\|}}{C}-O-CH_2-\overset{\overset{OH}{|}}{CH}-CH_2-$$

$$Acr: CH_2=CH-\underset{\underset{O}{\|}}{C}-$$

all based on the entire monomer

EXAMPLE 1

To an aluminum plate ground by brush, silicone primer "SH 4094 Primer", manufactured by Toray Silicone Co., Ltd. of Japan, was applied to the thickness of 1 μ. Onto the resultant film there was applied a silicone gum solution obtained by diluting RTV Silicone Gum Dispersion, "YE 3085" manufactured by Toshiba Silicone Co., Ltd. of Japan with n-heptane and adding to this diluted silicone gum dispersion benzoin ethylether in an amount of 3% by weight, calculated as solid, and the resultant applied silicone gum solution was dried by air to provide a 5 μ thick silicone gum layer. This silicone gum was a linear diorganopolysiloxane having acetoxy end group at which cross-linking could be produced by the action of atmospheric moisture through emitting acetic acid to give a rubber-like coating. The foregoing assembly will be termed the base and silicone gum layer.

Additionally, a 2 μ thick photoadhesive layer was applied on a 9 μ thick polypropylene film "Torayfan" manufactured by Toray Industries, Inc. of Japan, the photoadhesive layer having the following composition.

(a) Addition product of 4 mols of glycidyl methacrylate with 1 mol of xylylenediamine — 95% by weight (b) Benzoin methylether — 5% by weight Next, the base and silicone gum layer and the photoadhesive layer were so pressed together that the surface of the silicone rubber layer was in contact with and adhered closely to the surface of the photoadhesive layer to produce a presensitized planographic printing plate.

On this planographic printing plate, a negative transparency was applied and the two were caused to adhere closely to each other in vacuo. This was then irradiated from a distance of 10 cm for 3 minutes by light from a fluorescent lamp (FL20S-BL360, manufactured by Mitsubishi Electric Co., Ltd. of Japan).

When the "Torayfan" was peeled and the printing plate was then immersed in a 50% aqueous solution of isopropanol and lightly rubbed, the photoadhesive layer of the unexposed area was easily removed, whereas, at the same time the photoadhesive layer of the exposed area was photo-insolubilized and adhered strongly to the underlying silicone rubber layer so that a tenacious image relief remained.

By so doing, a planographic printing plate was obtained which corresponded to the image of the negative transparency throughout the entire printing plate. When this printing plate was mounted on a rotary offset duplicator, "Multilith 1250" manufactured by Addressograph Multigraph Co. and printed out using a printing ink, "Dricolor Black" manufactured by Dainippon Ink and Chemicals, Inc. of Japan, without using water for moistening, excellent printed matter was obtained. The printing press of this example had good image reproducibility and was capable of printing more than 10,000 copies.

EXAMPLE 2

On a crude aluminum plate whose surface had not been treated, a 2 μ thick halation-preventing layer of the following composition was provided.

(a) Styrene — acrylic acid (90:10 weight ratio) copolymer (intrinsic viscosity in cellosolve acetate: 0.3) 95 parts by weight (b) Michler's ketone — 5 parts by weight Next, to the surface of said halation-preventing layer, a 1% heptane solution of silicone primer "SH 4094" manufactured by Toray Silicone Co., Ltd. of Japan, was applied and dried.

Additionally, on a 9 μ thick "Torayfan" polypropylene film, a 5 μ thick photoadhesive layer having the following composition was provided.

(a) Copolyamide (a nylon 6 — nylon 66 - 2, 2, 4-trimethyl hexamethylenediamine adipate (30:35:35 by weight) copolymer — 37% by weight (b) Addition product of 1 mol of tartaric acid with 2 mols of glycidyl methacrylate 60% by weight (c) Benzophenone — 3% by weight (d) Phenothiazine — 0.01% by weight Onto this photoadhesive layer, a colution solution obtained by diluting with n-heptane, a heat-curing type silicone gum, "SH 7023" manufactured by Toray Silicone Co., Ltd. of Japan, and adding to the resultant diluted silicone gum dispersion, benzoin ethyl ether in an amount of 3% by weight calculated as solid, was applied and dried by air.

Next, this laminar assembly of "Torayfan," photoadhesive layer and silicone gum was applied under pressure to the aforesaid coated aluminum base plate with the surface of the silicone primer adhering closely to the surface of the silicone gum and thereafter the whole was heated at 100° C for 15 minutes, forming a presensitized planographic printing plate.

On the presensitized planographic printing plate so obtained, a negative transparency was applied and caused to adhere closely to said printing plate in vacuo, and was then irradiated for 2 minutes by light from a high pressure mercury lamp (ORC Jet Light 3000, at a distance of 1 m). The "Torayfan" was peeled off and thereafter the photoadhesive layer of the unexposed area was eluted by washing with modified ethanol. When printing was carried out similarly as in Example 1, good printed matter was obtained.

EXAMPLE 3

On a crude aluminum plate, a halation-preventing layer and a silicone primer layer were provided similarly as in Example 2, comprising a base layer. Additionally, on a 9 μ thick polyethylene terephthalate film, "Lumirror" manufactured by Toray Industries, Inc. of Japan, there was applied a 1 μ thick layer of "Gosenil GH 17", a polyvinyl alcohol manufactured by Nippon Gosei Kagaku Co., Ltd. of Japan, on which a 2 μ thick photoadhesive layer having the following composition was provided.

(a) Ethyl acrylate — methyl methacrylate — acrylic acid (70:20:10 weight ratio) copolymer (intrinsic viscosity in cellosolve acetate 0.4) — 55% by weight (b) Glycerol monoacrylate — 24% by weight
Ethylene glycol dia- — 16% by weight crylaye (c) Michler's ketone — 5% by weight To the surface of this photoadhesive layer was applied a solution obtained by diluting a silicone gum, "SH 9732," manufactured by Toray Silicone Co., Ltd. of Japan, with Naphtha No. 3 (manufactured by Esso) and this solution was then dried by air.

Next, the base layer and the foregoing composite photoadhesive and silicone gum layer were so pressed together that they adhered closely at the interface between the surface of the silicone primer and the surface of the silicone gum, and the assembly thereafter allowed to stand undisturbed for 24 hours.

The photosensitive planographic printing plate so obtained was at first denuded of the covering film to expose the polyvinyl alcohol layer on the surface of the printing plate and a negative transparency was placed on the surface of the polyvinyl alcohol layer, and exposed to light the same as in Example 2. The printing plate which had been exposed to light was easily developed by an aqueous solution of 0.2 N-sodium hydroxide and a strong ink-receptive image relief was produced on the surface of the silicone rubber.

EXAMPLE 4

Example 3 was repeated except that in producing the planographic printing plates the monomer components (b) of the photoadhesive layer were replaced by the following compounds.

(a) N-methylolacrylamide — 24% by weight
Ethylene glycol diacrylate — 16% by weight (b) Pentaerythritol diacrylate — 40% by weight (c) Addition product of 1 mol of acrylic acid with 1 mole of glycidyl methacrylate — 40% by weight (d) Addition product of 1 mol of N-methylolacrylamide with 1 mol of glycidyl methacrylate — 40% by weight When planographic printing plates produced in accordance with this example were exposed to light and developed the same as in Example 3, image relief strongly adhering to the surface of the silicone rubber layer were obtained in each case.

Comparative Example 1

Example 3 was repeated except for replacing the photopolymerizable monomer components (b) of the photoadhesive layer by the following photopolymerizable monomers not containing alcoholic hydroxyl groups.

(a) Ethylene glycol diacrylate — 40% by weight (b) Trimethylolethane triacrylate — 40% by weight (c) Methylenebisacrylamide — 20% by weight
Triethylene glycol diacrylate 20% by weight In each case of this comparative example, a relief of the image portion did not strongly adhere to the surface of the silicone rubber layer, but peeled off during the developing opertion or were peeled off by inking rollers upon printing several hundreds of copies, to give incomplete printed matters.

Comparative Example 2

Example 3 was repeated except for replacing the polymer component (a) of the photoadhesive layer by the following polymers having alcoholic hydroxyl groups and replacing the photopolymerizable monomers of (b) of the photoadhesive layer by the photopolymerizable monomers not containing alcoholic hydroxyl groups used in Comparative Example 1.

(a) 40% saponified product of polyvinyl acetate (b) Ethyl acrylate — styrene — 2-hydroxyethyl methacrylate — acrylamide — acrylic acid (64:14:12:2:8 weight ratio) copolymer (intrinsic viscosity in cellosolve acetate 0.3)

(c) Poly-2-hydroxypropyl methacrylate (intrinsic viscosity in cellosolve 0.2).

As a result of using any one of the above polymers of this comparative example, the adhesion between the image relief and the surface of the silicone rubber layer was very inferior similarly as in Comparative Example 1.

The following is claimed:

1. A negative acting presensitized dry planographic printing place comprising:
   (a) a flexible base layer,
   (b) a sparsely cross-linked linear diorganopolysiloxane layer overlying said base layer, and
   (c) a photoadhesive layer overlying said diorganopolysiloxane layer, and in direct contact therewith comprising at least one photopolymerizable unsaturated compound having a boiling point above 100° C and a photoinitiator wherein at least one said photopolymerizable compound has at least one hydroxyl group and at least one acryloyl group or one methacryloyl group in the same molecule and the total concentration of the hydroxyl groups and the total concentration of the acryloyl or methacryloyl groups in the photoadhesive layer are each greater than 0.1 mmol/g.

2. The negative-acting presensitized dry planographic printing plate of claim 1, wherein at least one kind of said photopolymerizable unsaturated compound is a member selected from the group consisting of
   (a) partial esters of acrylic and/or methacrylic acid with polyhydric alcohols having 2 – 12 carbon atoms,
   (b) addition product of glycidyl acrylate and/or methacrylate with hydrogen halides, alcohols, thiols, amines, carboxylic acids, sulfonic acids, phenols and phosphoric acids having 1 – 12 carbon atoms,
   (c) addition products of acrylic and/or methacrylic acid with epoxy compounds having 2 – 14 carbon atoms,
   (d) esters of N-methylolacrylamide or methacrylamide with oxy-carboxylic acids having 2 – 10 carbon atoms,
   (e) addition products of N-methylolacrylamide or methacrylamide with epoxy compounds having 2 – 12 carbon atoms.

3. The negative-acting presensitized dry planographic printing plate of claim 1, wherein at least one kind of the said photopolymerizable compound is a member selected from the group consisting of
   (a) partial esters of acrylic and/or methaacrylic acid with ethylene glycol, propylene glycol, glycerol, trimethylol methane, trimethylol ethane, trimethylol propane, sorbitol and pentaerythritol,
   (b) addition products of glycidyl acrylate or methacrylate with hydrogen chloride, methanol, ethylene glycol, trimethylol methane, pentaerythritol, ethanolamine, trimethanolamine, ethane dithiol, methylamine, ethylenediamine, xylylenediamine, aniline, phenylenediamine, acetic acid, acrylic acid, methacrylic acid, malonic acid, succinic acid, maleic acid, fumaric acid, itaconic acid, malic acid, tartaric acid, citric acid, phenol, thiophenol and hydroquinone,
   (c) addition products of acrylic and/or methacrylic acid with diglycidyl esters derived from the group consisting of phthalic acid, tetrahydrophthalic acid, succinic acid, adipic acid, maleic acid, fumaric acid and itaconic acid,
   (d) diesters of N-methylolacrylamide or methacrylamide with malic acid, tartaric acid, and citric acid, and
   (e) addition products of N-methylolacrylamide or methacrylamide with glycidyl esters of acrylic acid, methacrylic acid, phthalic acid, tetrahydrophthalic acid, maleic acid, fumaric acid and itaconic acid.

4. The negative-acting presensitized dry planographic printing plate of claim 1, wherein a halation preventing layer is interposed between said base layer and said diorganopolysiloxane layer such that less than 20% of the ultraviolet light of the wave length from 300 to 400 mμ is reflected.

5. A negative-acting presensitized dry planographic printing plate comprising:
   (a) a flexible base layer,
   (b) a sparsely cross-linked linear diorganopolysiloxane layer overlying said base layer,
   (c) a photoadhesive layer overlying said diorganopolysiloxane layer, comprising at least one photopolymerizable unsaturated compound having a boiling point above 100° C and a photoinitiator, wherein at least one kind of said photopolymerizable compound has at least one hydroxyl group and at least one acryloyl group or one methacryloyl group in the same molecule and the total concentration of the hydroxyl group and the total concentration of the acryloyl or methacryloyl groups in the photoadhesive layer are each greater than 0.1 mmol/g, and
   (d) a polymeric layer overlying said photoadhesive layer, capable of transmitting light of wave length from 300 to 400 mμ and protecting said photoadhesive layer from oxygen.

6. The method of preparing the negative-acting presensitized plate of claim 5 which comprises the steps of applying said photoadhesive layer on said polymeric layer and laminating said layers on said diorganopolysiloxane layer previously applied on said base layer with said photoadhesive layer in contact with said diorganopolysiloxane layer.

7. The method of preparing the negative-acting presensitized plate of claim 5, which comprises the steps of applying said diorganopolysiloxane layer on said photoadhesive layer previously applied on said polymeric layer and laminating said layers on said base layer with said diorganopolysiloxane layer in contact with said base layer.

8. The negative-acting presensitized plate of claim 1, wherein said diorganopolysiloxane layer incorporates a photosensitizer in the range of 0.1 – 10% by weight based upon the total weight of the silicone rubber layer.

9. The negative-acting presensitized film of claim 1, wherein said photoadhesive layer consists essentially of
   (a) said photopolymerizable unsaturated compound 5.0 – 99.0 parts by weight,
   (b) a photoinitiator 0.1 – 10.0 parts by weight,
   (c) a heat polymerization inhibitor 0.001 – 1.0 parts by weight, and
   (d) a filler for maintaining dimensional stability of said photoadhesive layer 0.01 – 90.0 parts by weight.

10. The negative-acting presensitized plate of claim 5, having a halation-preventing layer between said base layer and said diorganopolysiloxane.

11. The method of preparing the negative-acting presensitized plate of claim 10 which comprises the steps of applying said halation-preventing layer on said base layer, applying said photoadhesive layer on said polymeric layer, applying said diorganopolysiloxane gum layer on said photoadhesive layer, laminating said layers together under pressure with said halation-preventing layer in contact with said diorganopolysiloxane layer.

12. The negative acting dry planographic printing plate of claim 1, wherein the surface of said photoadhesive layer in contact with said diorganopolysiloxane layer has been pre-treated with silicone primer.

13. The negative acting presensitized dry planographic printing plate of claim 5, wherein the surface of said photoadhesive layer in contact with said diorganopolysiloxane layer has been pre-treated with silicone primer.

14. A negative acting presensitized dry planographic printing plate comprising:
   (a) a flexible base layer of polyethylene terephthalate, (b) a halation prevention layer on said base layer and comprising a styrene-acrylic acid copolymer and a photoinitiator,
(c) a sparsely cross-linked linear diorganopolysiloxane layer overlying said styrene-acrylic acid copolymer layer,
(d) a photoadhesive layer overlying said diorganosiloxane layer consisting of a composition comprising
  (1) an ethylacrylate-methylmethacrylate-acrylic acid copolymer,
  (2) the addition product of 4 mols of glycidyl methacrylate with 1 mol xylylenediamine and ethyleneglycol diacrylate, said addition product containing hydroxyl groups and acryloyl or methacryloyl groups and
  (3) a photoinitiator; the total concentration of the hydroxyl group and the total concentration of the acryloyl or methacryloyl groups in the photoadhesive layer each being greater than 0.1 mmol/g., and then,
(e) a layer of diorganopolysiloxane capable of transmitting light having a wavelength from 300 to 400 m$\mu$.

* * * * *